United States Patent [19]

Burkhart et al.

[11] Patent Number: 5,283,532
[45] Date of Patent: Feb. 1, 1994

[54] RECEIVER HAVING A LOCAL OSCILLATOR FIRST SYNCHRONIZED TO A REFERENCE FREQUENCY AND THEN TO A RECEIVED SIGNAL

[75] Inventors: Johann Burkhart, Pfaffenhofen; Johann Traub, Lauingen; Rolf Böhme, Bad Friedrichshall, all of Fed. Rep. of Germany

[73] Assignee: Temic Telefunken Microelectronic GmbH, Heilbronn, Fed. Rep. of Germany

[21] Appl. No.: 894,710

[22] Filed: Jun. 5, 1992

[30] Foreign Application Priority Data

Jun. 8, 1991 [DE] Fed. Rep. of Germany ....... 4118995
Aug. 6, 1991 [DE] Fed. Rep. of Germany ....... 4125995

[51] Int. Cl.[5] ...................... H03D 1/22; H03L 7/087; H04B 1/26
[52] U.S. Cl. .................................. 329/360; 329/361; 331/11; 331/14; 455/250.1; 455/260; 455/314; 455/337
[58] Field of Search .............. 329/360, 361, 362; 455/165.1, 196.1, 250.1, 259, 260, 264, 2.., 314, 337; 331/11, 14

[56] References Cited

U.S. PATENT DOCUMENTS

| | | | |
|---|---|---|---|
| 3,769,589 | 10/1973 | Buntschuh et al. | 331/55 X |
| 3,946,329 | 3/1976 | Caspari | 331/4 |
| 4,146,843 | 3/1979 | Isobe | 331/4 X |
| 4,205,272 | 5/1980 | Kumagai | 455/83 |
| 4,365,211 | 12/1982 | Lee | 331/11 |
| 4,461,035 | 7/1984 | Sakamoto | 455/164 |
| 4,631,499 | 12/1986 | Kasperkovitz | 331/11 |
| 4,905,307 | 2/1990 | Frank | 455/209 |

FOREIGN PATENT DOCUMENTS

| | | |
|---|---|---|
| 0184873 | 6/1986 | European Pat. Off. . |
| 2849447 | 5/1980 | Fed. Rep. of Germany . |
| 2941738 | 4/1981 | Fed. Rep. of Germany . |
| 3240565 | 5/1984 | Fed. Rep. of Germany . |
| 3309352 | 10/1984 | Fed. Rep. of Germany . |
| 3524146 | 1/1986 | Fed. Rep. of Germany . |
| 3616987 | 12/1986 | Fed. Rep. of Germany . |
| 3540380 | 5/1987 | Fed. Rep. of Germany . |
| 3726181 | 3/1988 | Fed. Rep. of Germany . |
| 3734882 | 3/1989 | Fed. Rep. of Germany . |
| 3733966 | 4/1989 | Fed. Rep. of Germany . |
| 3733967 | 4/1989 | Fed. Rep. of Germany . |
| 3819380 | 12/1989 | Fed. Rep. of Germany . |
| 9107016 | 5/1991 | PCT Int'l Appl. . |
| 591800 | 2/1978 | U.S.S.R. . |

OTHER PUBLICATIONS

Martin Kreuzer: "Ein synchroner Homodynempfänger . . ." Frequenz, 1988, H.5, pp. 147-152.
J. L. Linsley Hood: "Synchrodyne a.m. receiver" Electronics and Wireless World, Jan. 1986, pp. 51-54.
Floyd M. Gardner: "Phaselock Techniques" John Wiley & Sons, New York, 2nd Edition, 1979, pp. 121-125.

*Primary Examiner*—Siegfried H. Grimm
*Attorney, Agent, or Firm*—Spencer, Frank & Schneider

[57] ABSTRACT

A receiver array in accordance with the reception principle of synchronous demodulation, in which a controllable oscillator array is pre-synchronized to a set value for the oscillator frequency by a digital first control circuit having a reference frequency source during a pre-synchronization phase, and a heterodyne signal derived from the oscillator frequency is then synchronized with phase locking to the received useful signal by switching the oscillator control input to an analog second control circuit.

19 Claims, 1 Drawing Sheet

RECEIVER HAVING A LOCAL OSCILLATOR FIRST SYNCHRONIZED TO A REFERENCE FREQUENCY AND THEN TO A RECEIVED SIGNAL

BACKGROUND OF THE INVENTION

The invention relates to a receiver array for reception and demodulation of a useful signal with a preset carrier frequency, in particular of a radio signal from a time signal transmitter.

An array for receiving the radio signal from a time signal transmitter is known from German Patent DE 37 33 967 A1, in which array a quadrature demodulator is used.

The object of the present invention is therefore to provide an advantageous receiver array of the type mentioned at the outset.

SUMMARY OF THE INVENTION

The substance of the invention is that in a pre-synchronization phase the first control circuit dependably and clearly adjusts the frequency of the oscillator array to a value resulting from the design of the first control circuit and from a separate stable reference frequency, and that then the same oscillator array is connected in correct phase to the received useful signal by switching of the control signal to a second control circuit. The second control circuit only needs a narrow reception range, so that the noise bandwidth can be kept very low.

The array in accordance with the invention is particularly advantageous for a time signal receiver with quartz clock, in which the quartz of the clock is used as a reference frequency source.

BRIEF DESCRIPTION OF THE DRAWING

The invention is described in detail below on the basis of embodiments with reference to the FIGURE which is a block circuit diagram of a receiver circuit according to the invention.

DETAILED DESCRIPTION OF THE PREFERRED EMBODIMENT

Figure 1:
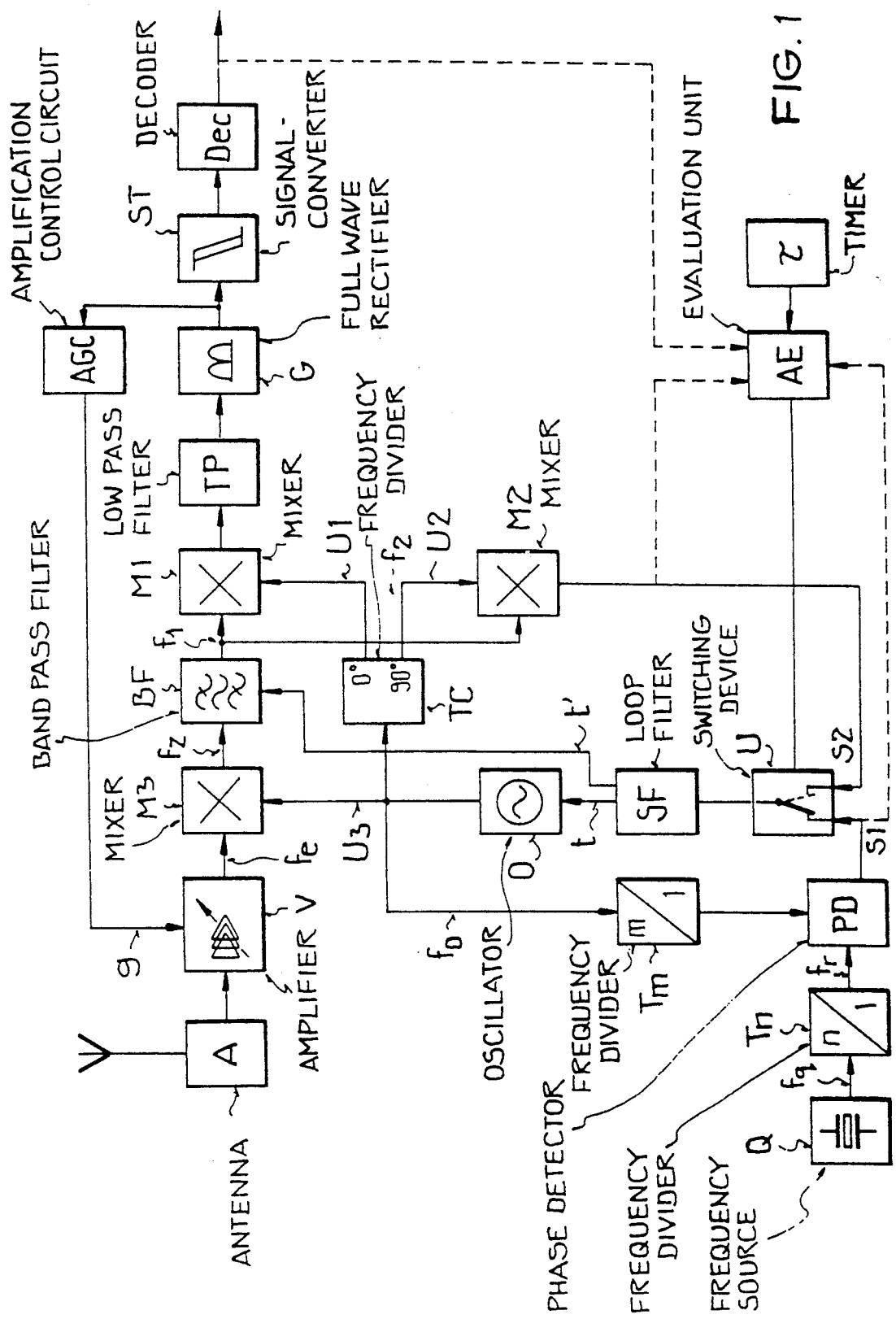

The received radio signal picked up by an antenna A is amplified in an amplifier having several stages if necessary and having an adjustable amplification level, and then synchronously demodulated by mixing it with a correct-phase heterodyne signal u1 in a first mixer M1. In the example shown in the FIGURE, the frequency of the input signal $f_r$ is converted in front of the first mixer to an intermediate frequency position by mixing the input signal with a third heterodyne signal u3 in a third mixer M3. The heterodyne signals u1, u3 are generated in an oscillator array and preferably derived from a common oscillator signal by frequency division. In the example sketched, the output signal of an oscillator O having the frequency fo is used directly as the third heterodyne signal $U_3$, from which output signal the first heterodyne signal ul of frequency f1 is derived in a first frequency divider $T_c$. The oscillator O is variable in its frequency using a control signal t that can be a control voltage or a control current. Two control circuits are available for obtaining the control signal t, and can alternatively be connected to the control input of the oscillator via a switching device U. The switching device U is actuated by an evaluation unit AE. To adjust the oscillator frequency, for example after switching on the receiver array, the evaluation unit AE sets the switching device U to the position shown with unbroken line for a pre-synchronization phase, so that the first control circuit is closed.

The first control circuit adjusts the frequency fo of the oscillator to a set value by comparing it with a stable reference frequency. For this purpose, the signal $f_c$ of the reference frequency source Q and the oscillator output signal $f_o$ are reduced in frequency in a manner known per se in frequency dividers Tn and Tm respectively having different divider factors n and m respectively, and passed to two inputs of the phase detector PD. The phase detector PD is preferably of the digital edge-triggered type. The output signal S1 of the phase detector PD is passed to the controllable oscillator O as a first control signal S1 via the switching device U and if necessary via a loop filter SF as control signal t. The first control circuit is designed, particularly with regard to the phase detector PD, such that a clear adjustment of the set frequency is ensured starting from the unadjusted state of the oscillator.

For receiving the radio signal of a time signal transmitter, the receiver array is advantageously operated in conjunction with a quartz clock, with the receiver array being used if necessary for correction of an incorrect setting of the quartz clock and, for example, only being operative for short periods after long intervals following failure of the voltage supply or similar. In an operating mode of this type, the oscillator frequency of the quartz clock is preferably used in addition as the reference source for the first control circuit.

After latching of the first control circuit, the oscillator o oscillates approximately at the set frequency and the frequency of the first heterodyne signal u1 largely corresponds to the useful signal frequency f1 at the input of the first mixer M1. The accuracy of the frequency setting depends on the quartz reference and is generally not sufficient for synchronous demodulation. In addition, the phase position between the first heterodyne signal u1 and the useful signal having frequency f1 at the first mixer M1 is still random when the first control circuit is latched. For exact phase synchronization of the two input signals of the first mixer, a second control circuit adjusts with phase locking the first heterodyne signal u1 to the useful signal at the input of the first mixer. For this purpose, the evaluation unit AE sets the switching device U to the switching position drawn with a broken line after latching of the first control circuit, and hence closes the second control circuit. In the second control circuit, a second mixer M2 is provided as a substantial element to which are supplied on the one hand the received signal from the input of the first mixer M1, and on the other hand a second heterodyne signal u2 phase-shifted by 90° relative to the first heterodyne signal u1. The output signal s2 of the second mixer forms a second control signal that is applied as a control signal t to the control signal input of the oscillator O via the switching device U and the loop filter SF in the demodulation phase. The 2-phase oscillator array required for generating the heterodyne signals u1 and u2 is preferably obtained by using a frequency divider for derivation of both signals from a common higher-frequency signal. In the example shown in the sketch, the frequency divider Tc is provided for this purpose. The divider factor k of this frequency divider is preferably k=4, since then the output signals of the divider, which comprises for example a multi-stage flip-flop array known per se, always dependably have a mutual 90° phase shift even when the duty cycle of the divider input signal is not ideal. Signals that do not match the frequency of the second heterodyne signal u2 and that are inside the received signal at the input of the second mixer lead to changing signal components in the output signal of the second mixer that are suppressed in the loop filter SF if they are outside the filter pass band. The bandwidth of the loop filter SF is selected as low as possible in order to reduce the noise bandwidth in the oscillator signal, but it must cover the frequency deviations still remaining after latching of the first control circuit. For operation of the switching device U by the evaluation unit AE, various assessments are conceivable as switching criteria in the evaluation unit. For switching from the pre-synchronization phase to the demodulation phase, for example, the following are advantageous either singly or in combination:

a) presetting of a minimum duration for presynchronization using a timer element Γ, e.g. a monoflop, and/or
b) monitoring of the first control signal to obtain a stable value.

For the event that signal reception is unsatisfactory due to poor synchronization, switching back of the switching device U from the demodulation setting to the pre-synchronization setting can be provided for, for which purpose c) the second control signal s2 and/or
d) the decoded reception signals are monitored singly or in combination in the evaluation unit preferably as switching criteria. Modulation of the useful signal must not of course trigger a switching operation here. A certain number of attempts at demodulation can be preset after which the operation is aborted should these attempts fail. To reduce the power consumption, the switching components required only for pre-synchronization such as the dividers Tm and Tn and the phase detector PD can be switched off during the demodulation phase. The design of the evaluating unit in detail can be widely varied. In particular, the evaluation unit can be split up into separate assessment circuits for various criteria and/or the evaluation unit can be provided on the basis of processing instructions in a processor intended for other purposes. The various assessment criteria in the evaluation unit are represented in the sketch as dash-dotted connecting lines to the appropriate signal points. The output signal of the first mixer M1 is filtered through a low-pass filter TP so that when the second control circuit is set correctly, a DC voltage stemming from the demodulated useful signal is present at the output of the low-pass filter TP. This voltage is level-modulated in the case of the time signal transmitter DCF 77 by recurrent short-term level reductions to 25% of the maximum level. These level jumps in the demodulated signal are converted into two-value data signals in a circuit ST with Schmitt trigger characteristic, and decoded in a decoder Dec.

A control signal g for the controllable amplifier V is obtained from the demodulated and low-pass-filtered reception signal by means of a level detector and control signal generator in an amplification control circuit AGC known per se. The full-wave rectifier G is advantageous for amplification control in the pre-synchronization phase, in which the output signal of the low-pass filter TP can still be varied at low frequency in the event of inexact frequency matching between the useful signal and the first heterodyne signal, or can disappear or assume negative values in the event of an unfavorable phase position between these two signals, so that for the amplification control circuit a setting can be possible during switching to the demodulation phase in which trouble-free operation of the second control circuit would not be assured. The full-wave rectifier G has the effect of permitting an approximate presetting of the amplification control circuit in the pre-synchronization phase too. In the demodulation phase, when there is a positive DC voltage at the output of the low-pass filter TP anyway, the full-wave rectifier is of no significance.

The use of frequency-selective means in front of the first mixer M1 can considerably improve phase noise in the first heterodyne signal and hence also the quality of the demodulated signals. A wide-band signal fe, if necessary pre-filtered by a resonant antenna connection, is present at the start of the amplifier V. The use of band-pass filter BP matched to the frequency f1 of the useful signal present at the input of the first mixer M1, if necessary after frequency conversion to an intermediate frequency position fz in the mixer M3, can largely eliminate interfering frequency components. Particularly advantageous is the use of a controllable band-pass filter whose center frequency is adjustable using a control signal t'. The controllable band-pass filter preferably has a structure largely identical to that of the controllable oscillator O. Since the frequency of the useful signal at the input of the first mixer M1 is identical to the frequency of the first heterodyne signal set using the control signal t, it is advantageous to derive the control signal t' for the controllable band-pass filter BP from the control circuit in the same way as the control signal t for the oscillator O, or even just to generate a uniform control signal t=t', and to supply it to both the oscillator O and the band-pass filter BP. In an array as shown in the sketch with frequency conversion of the input signal with a third heterodyne signal u3 of the frequency fo in a third mixer M3 and derivation of the first heterodyne signal u1 from the third heterodyne signal by frequency division with a divider factor k=4, a value of 62 kHz must be selected for reception of the DCF 77 time signal on 77.5 kHz, for example for the oscillator frequency fo, as a result of which the useful signal is in the intermediate frequency range at 15.5 kHz, corresponding exactly to the frequency of the first heterodyne signal u1 derived from u3, f1=fo/4=15.5 kHz. With a commonly used oscillator quartz q with an oscillation frequency of 32768 Hz, the divider factors in the first control circuit are advantageously selected as m=70 and n=37, or m=333 and n=176, in order to obtain an oscillator frequency of approx. 62 kHz. For receiving a time signal transmitted on the frequency 60 kHz, the frequency of the third heterodyne signal u3 can be, for example, fo=80 kHz and that of the first heterodyne signal f1=20 kHz, or fo=48 kHz and f1≙12 kHz.

Further examples and variations are within the scope of the usual knowledge of a man skilled in the art. In particular, the frequency of the third heterodyne signal can differ from the oscillator frequency and can also be the result of the latter due to frequency division. It is also possible to wholly dispense with intermediate frequency conversion and hence with the third heterodyne signal. It may also be advantageous to provide two separate loop filters instead of the loop filter SF, in order to take account where necessary of different requirements on the control properties in the pre-synchronization phase and in the demodulation phase.

What is claimed is:

1. A receiver array for reception and for demodulation of a useful signal with a given carrier frequency, in particular of the radio signal from a time signal transmitter, comprising:
- a signal path structured in accordance with the reception principle of synchronous demodulation;
- a controllable oscillator array for generating first and second heterodyne signals, with said first heterodyne signal being fed to a first mixer in said signal path for synchronous demodulation of the useful signal, and with said second heterodyne signal being phase-shifted by $\pi/2$ relative to said first heterodyne signal;
- a first control circuit having a stable reference source and a phase detector of a wide reception range for detecting a phase difference between the output signal of said reference source and said first heterodyne signal and generating a first control signal for said oscillator array corresponding to the difference;
- a second control circuit for generating a second control signal for said oscillator array for phase synchronization of said first heterodyne signal with the useful signal, said second control circuit comprising a second mixer which is supplied with said useful signal and said second heterodyne signal, and which produces said second control signal at its output; and;
- a switching means for applying said first control signal to the control signal input of said oscillator array during a presynchronization phase, and for applying said second control signal to the control signal input of said oscillator array during a subsequent demodulation phase.

2. An array according to claim 1, wherein it is operated in conjunction with a quartz clock and the reference source is the signal of the quartz oscillator of said quartz clock.

3. An array according to claim 1, wherein said first control circuit contains a digital phase detector.

4. An array according to claim 1, wherein the frequencies of said reference source and of said oscillator array differ and are supplied via frequency dividers having different divider factors to said phase detector of said first control circuit.

5. An array according to claim 1, wherein said first and second heterodyne signals are derived from a common oscillator signal by frequency division.

6. An array according to claim 1, characterized by frequency-selective means in the signal path in front of said first mixer.

7. An array according to claim 6, wherein said frequency-selective means contain a controllable filter whose control signal (t') like the control signal (t) for the oscillator array is derived from the control signals of said first and second control circuits.

8. An array according to claim 6, wherein said frequency-selective means contain a third mixer that converts the useful signal with a third heterodyne signal from said oscillator array into an intermediate frequency position and a band-pass filter for the intermediate frequency of said useful signal.

9. An array according to claim 8, wherein said first and second heterodyne signals are derived from said third heterodyne signal by 4:1 frequency division.

10. An array according to claim 1, wherein the duration of said pre-synchronization phase is limited by a permanently set timer element.

11. An array according to claim 1, wherein said switching means is controlled by an evaluation unit which monitors said first and/or said second control signal and/or the decoded useful signal.

12. An array according to claim 11, wherein said evaluation unit switches said switching device from the switch setting of the demodulation phase back to the switch setting of the pre-synchronization phase when the assessment of the monitored signals indicates that reception is not correct.

13. An array according to claim 1, characterized by an amplifier disposed at the receiver input and having a controllable amplification level and a further control circuit for controlling said amplifier.

14. An array according to claim 13, wherein said further control circuit contains a level detector to which is supplied the output signal of said first mixer.

15. An array according to claim 14, wherein a full-wave rectifier is disposed in front of said level detector.

16. An array according to claim 12, wherein the circuit components required exclusively for pre-synchronization are switched off in the demodulation phase.

17. A receiver for reception and for demodulation of a useful signal with a given carrier frequency, in particular of the radio signal from a time signal transmitter, comprising:
- a signal path structured in accordanc with the reception principle of synchronous demodulation path including a first mixer for the synchronous demodulation of a useful signal and a frequency selective means including a controllable filter located in front of said first mixer for frequency selection;
- a controllable oscillator array for generating a first heterodyne signal which is fed to said first mixer for synchronous demodulation of the useful signal in said first mixer;
- a first control circuit having a stable reference source and a phase detector of a wide reception range for receiving the signal from said reference source and an output signal from said oscillator array and for generating a first control signal for said oscillator array;
- a second control circuit for generating a second control signal for said oscillator array for phase synchronization of said first heterodyne signal with the useful signal;
- a switching means for applying said first control signal to the control signal input of said oscillator array during a presynchronization phase, and for applying said second control signal to the control signal input of said oscillator array during a subsequent demodulation phase;
- and means, connected to said control signal input, for deriving a control signal for said controllable filter from said first and second control signals.

18. A receiver according to claim 17, wherein said frequency selective means further includes a second mixer for converting the useful signal into an intermediate frequency position by mixing the useful signal with a second heterodyne signal from said oscillator array, and said controllable filter is a band pass filter for said intermediate frequency of the useful signal.

19. A receiver for reception and for demodulation of a useful signal with a given carrier frequency, in particular of the radio signal from a time signal transmitter, comprising;
- a signal path structured in accordance with the reception principle of synchronous demodulation;

a controllable oscillator array generating a first heterodyne signal for synchronous demodulation of the useful signal in a first mixer disposed in said signal path;

a first control circuit having a stable reference source and a phase detector of a wide reception range for comparing the phase of the output signal from said reference source and an output signal of said oscillator array and for generating a first control signal for said oscillator array;

a second control circuit for generating a second control signal for said oscillator array for phase synchronization of said first heterodyne signal with the useful signal;

a switching means for applying said first control signal to the control input of said oscillator array during a presynchronization phase, and for applying said second control signal to the control signal input of said oscillator array during a subsequent demodulation phase; and control means for switching off those circuit components required exclusively for said presynchronization phase during said demodulation phase, for monitoring at least one of said first control signal, said second control signal and the useful signal, and for switching said switching means from a position corresponding to said demodulation phase back to a position corresponding to said presynchronization phase when the assessment of the monitored signals indicates that reception is not correct.

* * * * *